(12) United States Patent
Takahashi et al.

(10) Patent No.: US 7,190,027 B2
(45) Date of Patent: Mar. 13, 2007

(54) SEMICONDUCTOR DEVICE HAVING HIGH WITHSTAND CAPACITY AND METHOD FOR DESIGNING THE SAME

(75) Inventors: Shigeki Takahashi, Okazaki (JP); Kazunori Kawamoto, Anjo (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/891,176

(22) Filed: Jul. 15, 2004

(65) Prior Publication Data
US 2005/0029589 A1 Feb. 10, 2005

(30) Foreign Application Priority Data
Aug. 6, 2003 (JP) .............................. 2003-288183
Jun. 7, 2004 (JP) .............................. 2004-168730

(51) Int. Cl.
*H01L 29/94* (2006.01)
(52) U.S. Cl. ....................................... 257/339; 257/341
(58) Field of Classification Search ................ 257/343, 257/341, 342, 339
See application file for complete search history.

(56) References Cited

U.S. PATENT DOCUMENTS

| 6,465,839 | B2 | 10/2002 | Takahashi et al. |
| 6,573,144 | B2 | 6/2003 | Takahashi et al. |
| 2002/0153592 | A1 | 10/2002 | Takahashi et al. |

FOREIGN PATENT DOCUMENTS

| JP | A-2002-299346 | 10/2002 |
| JP | A-2004-95761 | 3/2004 |
| JP | A-2005-340465 | 12/2005 |

*Primary Examiner*—Douglas W. Owens
(74) *Attorney, Agent, or Firm*—Posz Law Group, PLC

(57) ABSTRACT

A semiconductor device includes a semiconductor substrate, a low concentration region, an intermediate concentration region, the first electrode region, and the second electrode region. The device has a current-voltage characteristic having the first and second break points. The voltage of the first break point is equal to or smaller than that of the second break point. The device has a maximum current density when the device is applied with an electrostatic discharge surge. The current density of the first break point is smaller than the maximum current density, and the current density of the second break point is larger than the maximum current density.

30 Claims, 11 Drawing Sheets

//patents.google.com/patent/US7190027B2/en

SEMICONDUCTOR DEVICE HAVING HIGH WITHSTAND CAPACITY AND METHOD FOR DESIGNING THE SAME

CROSS REFERENCE TO RELATED APPLICATIONS

This application is based on Japanese Patent Applications No. 2003-288183 filed on Aug. 6, 2003, and No. 2004-168730 filed on Jun. 7, 2004, the disclosures of which are incorporated herein by reference.

FIELD OF THE INVENTION

The present invention relates to a semiconductor device having a high withstand capacity and a method for designing the same.

BACKGROUND OF THE INVENTION

A lateral diffused metal oxide semiconductor transistor (i.e., LDMOS transistor) is suitably used for a semiconductor device such as an electronic control unit (i.e., ECU) for controlling an automotive vehicle and an ECU for controlling electronic equipment. Specifically, the LDMOS transistor works as a power device (i.e., a power integrated circuit). An electrostatic discharge (i.e., ESD) surge is sometimes applied to the LDMOS transistor. For example, the LDMOS transistor used for the vehicle is required to have a large withstand capacity against the ESD surge (i.e., a large ESD surge withstand capacity). Specifically, the withstand capacity of the LDMOS transistor is, for example, about 15 kV in a case where the ESD surge has an impedance of 150 $\Omega$ and 150 pF. When the ESD surge is applied to the transistor, a transient current flows between terminals of the LDMOS transistor. The transient current changes with time. The maximum transient current, i.e., a surge current, is, for example, about 200 Ampere in a case where the transistor is used for an automotive vehicle. When the surge current is applied to the LDMOS transistor, the current concentrates into a local portion of the LDMOS transistor in a case where a device area of the LDMOS transistor is comparatively small. This concentration of the current is caused by a snap back effect. The snap back effect is such that a negative resistance is generated in a current-voltage characteristic of the LDMOS transistor. Therefore, the local portion of the LDMOS transistor may be melted thermally so that the LDMOS does not work (i.e., the LDMOS transistor fails).

In a conventional LDMOS transistor, the device area is small. Therefore, it is difficult to protect the LDMOS transistor from locally melting down. Therefore, a protection device as an external circuit is added to the LDMOS transistor so that a required withstand capacity against the ESD surge is obtained. However, when the protection device as the external circuit is added, a cost of the semiconductor device becomes higher. Further, dimensions of the semiconductor device become larger.

In a case where the device does not have the protection device, the device area of the LDMOS transistor is equal to or smaller than 1 mm$^2$, which satisfies the required withstand capacity economically. Since the maximum ESD surge current is 200 Ampere (i.e., 200 A), the maximum surge current density per unit area Imax is equal to or larger than 200 Ampere per square millimeters (i.e., 200 A/mm$^2$). A LDMOS transistor having the withstand capacity against the maximum surge current density Imax of 200 A/mm$^2$ is disclosed in Japanese Patent Application Publication No. 2001-352070 (i.e., U.S. Pat. No. 6,465,839 and No. 6,573,144). One cell of the LDMOS transistor 300 is shown in FIG. 13. In the actual LDMOS transistor 300, the one cell shown in FIG. 13 and another cell, which is provided by reversing the one cell horizontally, are alternately repeated. That is, the one cell and the other cell are symmetrically and alternately disposed in the LDMOS transistor 300.

The LDMOS transistor 300 is formed on a SOI (i.e., silicon on insulator) substrate having a P conductivity type silicon substrate 302, an insulation layer 303 and an N conductivity type layer 301. In the LDMOS transistor 300, an N conductivity type region 306 surrounds an N$^+$ conductivity type drain region 305. The impurity concentration of the N conductivity type region 306 is higher than that of the N conductivity type layer 301. Further, the impurity concentration of the N conductivity type region 306 becomes higher as it approaches the N$^+$ conductivity type drain region 305. A P$^+$ conductivity type contact region 309 is disposed adjacent to an N$^+$ conductivity type source region 308. The P$^+$ conductivity type contact region 309 is disposed under the N$^+$ conductivity type source region 308. Further, a P conductivity type base region 307 as a channel is disposed under the P$^+$ conductivity type contact region 309 and under the N$^+$ conductivity type source region 308. A LOCOS (i.e., local oxidation of silicon) region 304 is disposed between the P conductivity type base region 307 and the N conductivity type region 306. A gate insulation film 310 is disposed on the N conductivity type layer 301. A gate electrode 311 is disposed on the N conductivity type layer 301 through the gate insulation film 310. An interlayer insulation film 312 covers the gate electrode 311 and the LOCOS region 304. A source electrode 313 is disposed on one side of the interlayer insulation film 312, and a drain electrode 314 is disposed on the other side of the interlayer insulation film 312.

In the LDMOS transistor 300, the impurity concentration of the N conductivity type region 306 becomes higher as it approaches the N$^+$ conductivity type drain region 305, so that a generation current at a break point in current-voltage characteristics becomes large. Further, the P$^+$ conductivity type contact region 309 is arranged in a predetermined position shown in FIG. 13 so that a parasitic transistor composed of the N$^+$ conductivity type source region 308, the P conductivity type base region 307 and the N conductivity type layer 301 is prevented from turning on. Therefore, the ESD surge withstand capacity of the LDMOS transistor 300 is improved.

In the LDMOS transistor 300, when the impurity concentration of the N conductivity type region 306 is in a range between $5 \times 10^{16}$/cm$^3$ and $2 \times 10^{17}$/cm$^3$, the ESD surge withstand capacity of the LDMOS transistor 300 becomes maximum. However, when the dimensions of the N conductivity type region 306 are certain values, the ESD surge withstand capacity is reduced. Therefore, the LDMOS transistor 300 may not satisfy the required withstand capacity.

SUMMARY OF THE INVENTION

In view of the above-described problem, it is an object of the present invention to provide a semiconductor device having high withstand capacity. It is another object of the present invention to provide a method for designing a semiconductor device with high withstand capacity.

A semiconductor device includes: a semiconductor substrate; a low concentration region disposed in the substrate and including a first conductivity type impurity with a low impurity concentration; an intermediate concentration region disposed in the low concentration region and including the first conductivity type impurity with an intermediate impurity concentration; a first electrode region disposed in the intermediate concentration region and including the first conductivity type impurity with a high impurity concentration; and a second electrode region disposed in the low concentration region and including the first conductivity type impurity with a different impurity concentration different from the low impurity concentration of the low concentration region. The low concentration region and the intermediate concentration region provide a first boundary therebetween. The intermediate concentration region and the first electrode region provide a second boundary therebetween. The device has a current-voltage characteristic between the first and second electrode regions. The current-voltage characteristic includes a first break point attributed to the first boundary and a second break point attributed to the second boundary. The first break point has a voltage, which is equal to or smaller than another voltage of the second break point. The device has a maximum current density flowing between the first and second electrode regions when the device is applied with an electrostatic discharge surge. The first break point has a current density, which is smaller than the maximum current density. The second break point has another current density, which is larger than the maximum current density.

The above semiconductor device has high withstand capacity.

Preferably, the intermediate impurity concentration of the intermediate concentration region is equal to or larger than $0.8 \times 10^{17}/cm^3$. The intermediate concentration region has a width, which is determined by an opening width of a mask for forming the intermediate concentration region. The width of the intermediate concentration region is equal to or larger than 8 μm.

Preferably, the device further includes a second conductivity type region having a second conductivity type impurity and disposed in the substrate between the intermediate concentration region and the second electrode region. The second electrode region includes the first conductivity type impurity with a high impurity concentration. The device is a depression type junction field effect transistor, which is controlled by a gate electrode disposed on the second conductivity type region.

Preferably, the device further includes a first terminal disposed on the substrate and connecting to the first electrode region, and a second terminal disposed in a trench in the low concentration region. The second electrode region is disposed in a bottom of the trench so that the second electrode connects to the second terminal. The device is a vertical type semiconductor device.

Preferably, the device further includes a second conductivity type region having a second conductivity type impurity and disposed in the low concentration region. The second electrode region is disposed in the second conductivity type region and includes the first conductivity type impurity with a high impurity concentration. More preferably, the impurity concentration of the low concentration region is equal to or lower than $20 \times 10^{15}/cm^3$. More preferably, the intermediate concentration region has a surface impurity concentration defined as Nad. The intermediate concentration region has a width defined as 2La, the width determined by an opening width of a mask for forming the intermediate concentration region. The surface impurity concentration of the intermediate concentration region is larger than $0.375 \times 10^{17}/cm^3$, and is smaller than $1.5 \times 10^{17}/cm^3$. The surface impurity concentration and the width of the intermediate concentration region have a relationship as:

$$2La > -3.5 \times Nad + 10^{17} + 9.25.$$

Preferably, the device further includes a gate electrode disposed on the second electrode region and on the second conductivity type region; a drain electrode disposed on the first electrode region; and a source electrode disposed on the second electrode region. The device is a lateral diffused metal oxide semiconductor transistor.

Preferably, the device further includes: a base electrode disposed on the second conductivity type region; a collector electrode disposed on the first electrode region; and an emitter electrode disposed on the second electrode region. The device is a bipolar transistor.

Further, a semiconductor device includes: a semiconductor substrate; a low concentration region disposed in the substrate and including a first conductivity type impurity with a low impurity concentration; an intermediate concentration region disposed in the low concentration region and including the first conductivity type impurity with an intermediate impurity concentration; a first electrode region disposed in the intermediate concentration region and including the first conductivity type impurity with a high impurity concentration; and a second electrode region disposed in the low concentration region and including a second conductivity type impurity. The low concentration region and the intermediate concentration region provide a first boundary therebetween. The intermediate concentration region and the first electrode region provide a second boundary therebetween. The device has a current-voltage characteristic between the first and second electrode regions. The current-voltage characteristic includes a first break point attributed to the first boundary and a second break point attributed to the second boundary. The first break point has a voltage, which is equal to or smaller than another voltage of the second break point. The device has a maximum current density flowing between the first and second electrode regions when the device is applied with an electrostatic discharge surge. The first break point has a current density, which is smaller than the maximum current density. The second break point has another current density, which is larger than the maximum current density.

The above semiconductor device has high withstand capacity.

Further, a method for designing a semiconductor device is provided. The device includes: a semiconductor substrate having a surface portion; a first terminal disposed on the substrate; a second terminal disposed on the substrate; a low concentration region disposed in the surface portion of the substrate and including a first conductivity type impurity with a low impurity concentration; an intermediate concentration region disposed in the low concentration region and including the first conductivity type impurity with a intermediate impurity concentration; a first electrode region disposed in the intermediate concentration region and including the first conductivity type impurity with a high impurity concentration; and a second electrode region disposed in the low concentration region and including the first conductivity type impurity with a different impurity concentration different from the low impurity concentration of the low concentration region. The first terminal connects to the first electrode region. The second terminal connects to the second electrode region. The intermediate concentration region has a surface impurity concentration. The intermediate concentration region has a width, which is determined by an opening width of a mask for forming the intermediate concentration region. The method includes the step of determining the impurity concentration of the intermediate concentration region and the width of the intermediate concentration region so that the device has a predetermined current-voltage characteristic between the first and second terminals.

The above method provides the semiconductor device having high withstand capacity.

Preferably, the device further includes a second conductivity type region having the second conductivity type impurity and disposed in the low concentration region. The second electrode region is disposed in the second conductivity type region and includes the first conductivity type impurity having a high impurity concentration. The method further includes the step of determining the impurity concentration of the low concentration region so that a withstand voltage of the device becomes a predetermined voltage.

Further, a method for designing a semiconductor device is provided. The device includes: a semiconductor substrate having a surface portion; a first terminal disposed on the substrate; a second terminal disposed on the substrate; a low concentration region disposed in the surface portion of the substrate and including a first conductivity type impurity with a low impurity concentration; an intermediate concentration region disposed in the low concentration region and including the first conductivity type impurity with a intermediate impurity concentration; a first electrode region disposed in the intermediate concentration region and including the first conductivity type impurity with a high impurity concentration; and a second electrode region disposed in the low concentration region and including the first conductivity type impurity having a different impurity concentration different from that of the low concentration region. The first terminal connects to the first electrode region. The second terminal is disposed in a trench in the surface portion of the substrate, and connects to the second electrode region through a sidewall insulation film. The low concentration region and the intermediate concentration region provide a first boundary therebetween. The intermediate concentration region and the first electrode region provide a second boundary therebetween. The device has a current-voltage characteristic between the first and second terminals. The current-voltage characteristic includes first and second break points, at which a gradient of the current-voltage characteristic is suddenly changed. The device has a maximum current density flowing between the first and second terminals when the device is applied with an electrostatic discharge. The method further includes the steps of: determining a voltage at the first break point equal to or smaller than another voltage at the second break point; determining a current density at the first break point smaller than the maximum current density; and determining a current density at the second break point larger than the maximum current density.

The above method provides the semiconductor device having high withstand capacity.

Further, a method for designing a semiconductor device is provided. The device includes: a semiconductor substrate having top and bottom surface portions; a first terminal disposed on the top surface portion of the substrate; a second terminal disposed on the bottom surface portion of the substrate; a low concentration region disposed in the top surface portion of the substrate and including a first conductivity type impurity with a low impurity concentration; an intermediate concentration region disposed in the low concentration region and including the first conductivity type impurity with a intermediate impurity concentration; a first electrode region disposed in the intermediate concentration region and including the first conductivity type impurity with a high impurity concentration; and a second electrode region disposed in the bottom surface portion of the substrate and including the first conductivity type impurity with a high impurity concentration. The first terminal connects to the first electrode region at the top surface portion of the substrate. The second terminal connects to the second electrode region at the bottom surface portion of the substrate. The low concentration region and the intermediate concentration region provide a first boundary therebetween. The intermediate concentration region and the first electrode region provide a second boundary therebetween. The device has a current-voltage characteristic between the first and second terminals. The current-voltage characteristic includes first and second break points, at which a gradient of the current-voltage characteristic is suddenly changed. The device has a maximum current density flowing between the first and second terminals when the device is applied with an electrostatic discharge. The method further includes the steps of: determining a voltage at the first break point equal to or smaller than another voltage at the second break point; determining a current density at the first break point smaller than the maximum current density; and determining another current density at the second break point larger than the maximum current density.

The above method provides the semiconductor device having high withstand capacity.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS (First Embodiment)

Figure 1A:
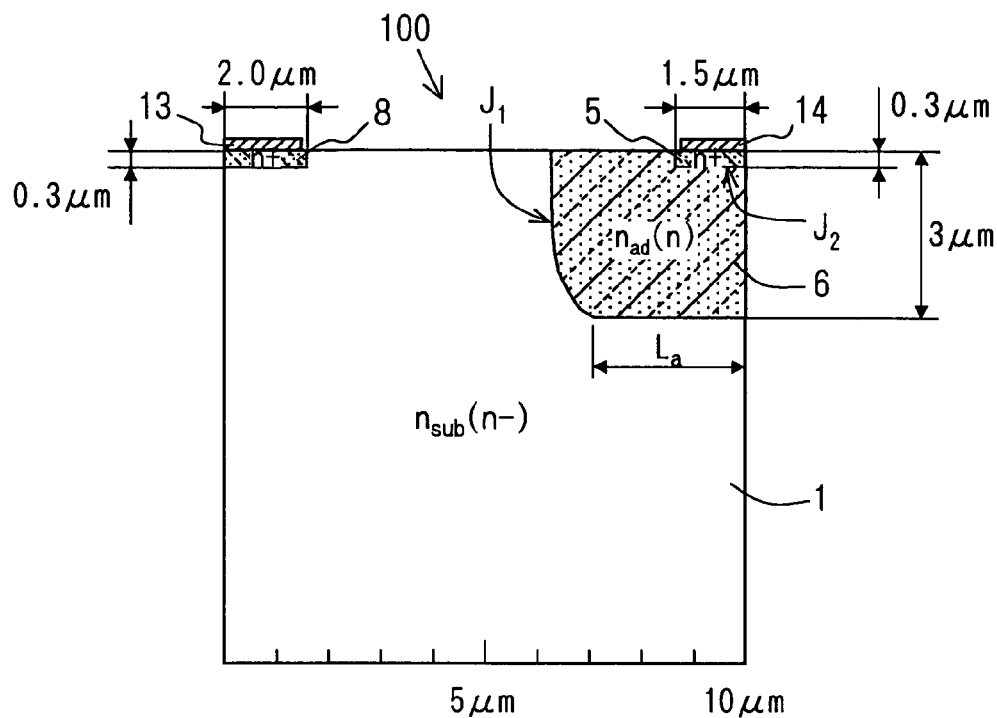
FIG. 1A is a cross sectional view showing a part of a semiconductor device according to a first embodiment of the present invention.
Figure 1B:
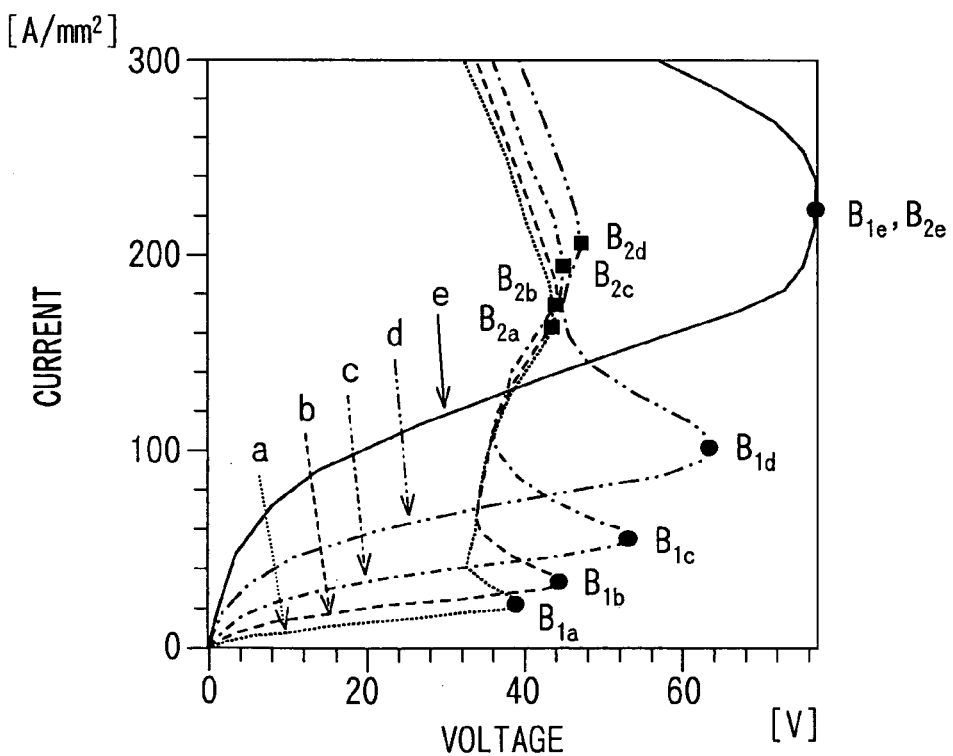
FIG. 1B is a graph showing current-voltage characteristics of the device according to the first embodiment.

The inventors have preliminary studied about an ESD surge withstand capacity. Specifically, the inventors have studied about essential factors contributed to the ESD surge withstand capacity. To find the essential factors, a semiconductor device 100 as a testing device is prepared, as shown in FIG. 1A. The device 100 includes an $N^+$ conductivity type source region 8, an N conductivity type region 6 and an $N^+$ conductivity type drain region 5 disposed in an N conductivity type layer 1. Therefore, the device 100 is provided by the LDMOS transistor 300 in FIG. 13 without the P conductivity type base region 307 and the $P^+$ conductivity type contact region 309. FIG. 1A shows one cell of the device 100. In the actual device 100, the one cell shown in FIG. 1A and another cell, which is provided by reversing the one cell horizontally, are alternately repeated. That is, the one cell and the other cell are symmetrically and alternately disposed in the device 100. FIG. 1B shows a simulation result of current-voltage characteristics of the device 100. Specifically, in the device 100, different impurity concentrations of the N conductivity type layer 1, which has a comparatively low impurity concentration, are tested. FIG. 1B shows various current-voltage characteristics of the device 100 having different impurity concentrations Nsub of the N conductivity type layer 1.

Figure 13:
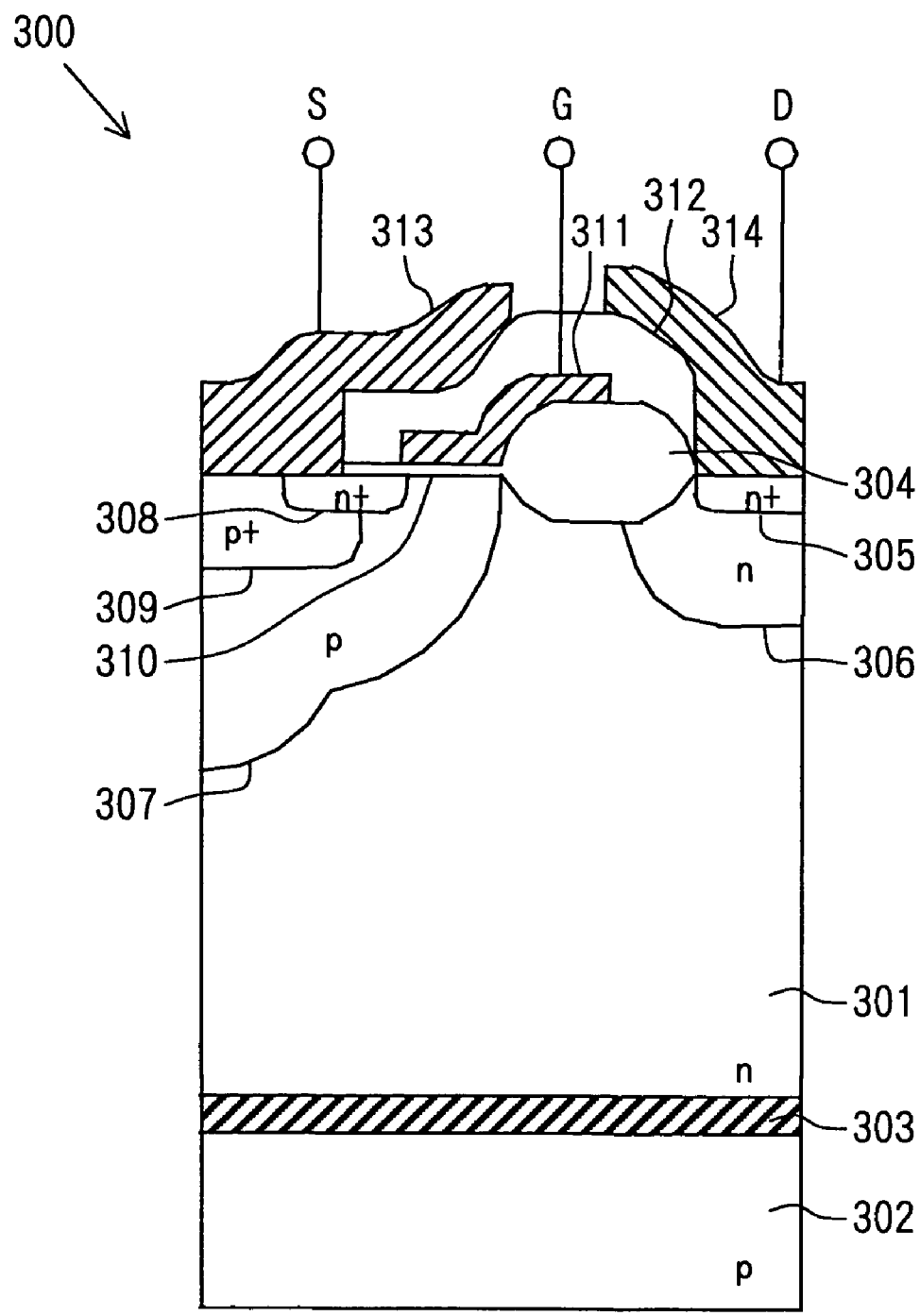
FIG. 13 is a cross sectional view showing a semiconductor device including a LDMOS transistor according to a prior art.

As shown in FIG. 1A, the device 100 includes the first electrode, which corresponds to the drain electrode 314 in FIG. 13, and the second electrode, which corresponds to the source electrode 313 in FIG. 13. The device 100 further includes the N conductivity type layer 1, which corresponds to the N conductivity type layer 301 in FIG. 13. The N conductivity type layer 1 in FIG. 1A is formed on one surface of a semiconductor substrate (not shown), and has a low impurity concentration Nsub of an N conductivity type impurity so that the N conductivity type layer 1 provides a low concentration region (i.e., Nsub region or $N^-$ region). In the low concentration region 1, the N conductivity type region 6 is formed. The N conductivity type region 6, which corresponds to the N conductivity type region 306 in FIG. 13, has an intermediate impurity concentration Nad of the N conductivity type impurity so that the N conductivity type region 6 provides an intermediate concentration region (i.e., Nad region or N region). In the intermediate concentration region 6, the first electrode region 5 is formed. The first electrode region 5, which corresponds to the $N^+$ conductivity type drain region 305 in FIG. 13, has a high impurity concentration of the N conductivity type impurity so that the first electrode region 5 provides a high concentration region.

The first electrode region 5 has the high impurity concentration so that the first electrode region 5 connects to the first terminal 14 with ohmic contact. In the low concentration region 1, the second electrode region 8 is formed. The second electrode region 8, which corresponds to the $N^+$ conductivity type source region 308 in FIG. 13, has a high impurity concentration of the N conductivity type impurity so that the second electrode region 8 provides a high concentration region. The impurity concentration of the second electrode region 8 is higher than that of the low concentration region 1. The second electrode region 8 has the high impurity concentration so that the second electrode region 8 connects to the second terminal 13 with ohmic contact. Thus, in the device 100, the first terminal 14 connects to the first electrode region 5, and the second terminal 13 connects to the second electrode region 8.

In the device 100, the first electrode region 5 has a width of 1.5 μm and a thickness of 0.3 μm. The second electrode region 8 has a width of 2.0 μm and a thickness of 0.3 μm. The intermediate concentration region 6 has a depth of 3 μm and a length 2La, which is the width of an opening of a mask for implanting impurity ions. Specifically, the mask having the opening width of 2La is used for forming the intermediate concentration region 6. A length La shown in FIG. 1A is a half the actual length of the intermediate concentration region 6. In this embodiment, the opening width 2La is set to be 6 μm. Therefore, the half length La of the intermediate concentration region 6 is 3 μm. After the intermediate concentration region 6 is formed by the ion implantation method, the device 100 is annealed so that the impurity in the intermediate concentration region 6 is diffused. This thermal diffusion causes the periphery of the intermediate concentration region 6 extend outside about 2.4 μm.

The first terminal 14 is applied with a positive voltage with respect to the second terminal 13. In FIG. 1B, current-voltage characteristic curves a–e are obtained by the device 100 having different impurity concentrations Nsub of the low concentration region 1. In the characteristic curve a, the impurity concentration Nsub is $1 \times 10^{15}/cm^3$, the impurity concentration of the curve b is $2 \times 10^{15}/cm^3$, the curve c $4 \times 10^{15}/cm^3$, the curve d $8 \times 10^{15}/cm^3$, and the curve e $16 \times 10^{15}/cm^3$. Here, the surface impurity concentration of the intermediate concentration region 6 disposed near the first electrode region 5 is $1 \times 10^{17}/cm^3$, and each surface impurity concentration of the first and second electrode regions 5, 8 disposed near the upper surface is $1 \times 10^{20}/cm^3$, respectively.

In each characteristic curve a–e, two break points (i.e., bending points) appear. At the break point, the curvature (i.e., the gradient) of each characteristic curve a-e drastically (i.e., suddenly) changes. When the voltage increases from zero, the first break point B1a–B1e is appeared firstly in the characteristic curve a–e. The first break point B1a–B1e largely depends on the impurity concentration Nsub of the low concentration region 1. The first break point B1a–B1e is attributed to the first boundary J1 disposed between the low concentration region 1 and the intermediate concentration region 6. In the characteristic curve a–e, after it passes through the first break point B1a–B1e, a negative resistance part appears in the characteristic curve a–e. Then, the negative resistance part changes to a positive resistance part having a positive characteristic. Then, the second break point B2a–B2e appears in the characteristic curve a–e. Here, in the characteristic curve e, the second break point B2e overlaps the first break point B1e. The second break point B2a–B2e does not depend on the impurity concentration Nsub of the low concentration region 1 substantially. Therefore, the second break point B2a–B2e is attributed to the second boundary J2 disposed between the intermediate concentration region 6 and the first electrode region 5. In the characteristic curve a–e, after it passes through the second break point B2a–B2e, another negative resistance part appears in the characteristic curve a–e.

In each characteristic curve a–e, a voltage and a current density at each first break point B1a–B1e attributed to the first boundary J1 are defined as the first break point voltage Vb1 (Volts) and the first break point current density Ib1 (Ampere per square millimeters), respectively. A voltage and a current density at each second break point B2a–B2e attributed to the second boundary J2 are defined as the second break point voltage Vb2 (V) and the second break point current density Ib2 (A/mm²), respectively. The relationship between the voltages Vb1, Vb2 and the current densities Ib1, Ib2 at two break points B1a–B1e, B2a–B2e determines a snap back characteristic. In the device 100, the impurity concentrations among the low concentration region 1, the intermediate concentration region 6 and the first electrode region 5 become higher in this order. The first break point current density Ib1 attributed to the first boundary J1 and the second break point current density Ib2 attributed to the second boundary J2 have the following relationship, as shown in FIG. 1B.

$$Ib1 < Ib2 \tag{F1}$$

On the other hand, the first break point voltage Vb1 attributed to the first boundary J1 and the second break point voltage Vb2 attributed to the second boundary J2 does not have a simple relationship. Each first break point voltage Vb1a–Vb1e and each first break point current density Ib1a–Ib1e at the first break point B1a–B1e becomes larger as the impurity concentration of the low concentration region 1 becomes higher. On the other hand, the second break point voltage Vb2 and the second break point current density Ib2 at the second break point B2a–B2e does not change substantially, even when the impurity concentration of the low concentration region 1 becomes higher. Therefore, in the negative resistance part disposed between the first and second break points B1a–B1e, B2a–B2e, a voltage drop (i.e., a snap back of voltage) becomes larger, as the impurity concentration of the low concentration region 1 becomes higher.

In view of the result shown in FIG. 1B, the first and second break point current densities Ib1, Ib2 have the following relationship.

$$Ib1 < Imax < Ib2 \tag{F2}$$

Here, the maximum current density flowing between the first and second terminals 13, 14 is defined as Imax in a case where the ESD surge is applied to the device 100. When the maximum current density Imax of the device 100 is disposed between the first and second break points B1a–B1e, B2a–B2e, and the impurity concentration of the low concentration region 1 is high such as $4 \times 10^{15}/cm^3$ in the characteristic curve c or $8 \times 10^{15}/cm^3$ in the characteristic curve d, the snap back of voltage, i.e., the voltage drop becomes larger. Therefore, it is not preferable in the device 100.

However, in the characteristic curves a, b as shown in FIG. 1B, the first and second break point voltages Vb1, Vb2 have the following relationship.

$$Vb1 \leq Vb2 \tag{F3}$$

In this case, the snap back effect at the first boundary J1 is suppressed because of the existence of the second boundary J2 so that the negative resistance part between the first and second break points B1a, B1b, B2a, B2b becomes smaller. Specifically, the voltage drop at the first break point B1a, B1b in the curve a, b attributed to the first boundary J1 is comparatively suppressed, compared with the voltage drop at the first break point B1c, B1d in the curve c, d. Therefore, even when the ESD surge is applied to the device 100, the device 100 disposed in a state of the negative resistance part is prevented from breaking. That is, the failure rate of the device 100 in the negative resistance part is reduced. Therefore, when the device 100 has the impurity concentration of the low concentration region 1 such as $1 \times 10^{15}/cm^3$ showing the characteristic curve a or $2 \times 10^{15}/cm^3$ showing the characteristic curve b, the negative resistance part of the device 100 between the first and second break points B1a, B1b, B2a, B2b becomes small. Even when the maximum current density Imax of the device 100 is disposed between the first and second break points B1a, B1b, B2a, B2b, the voltage drop (i.e., the snap back of voltage) is suppressed so that the current is not concentrated into a local portion of the device 100. Accordingly, the device 100 has a high ESD surge withstand capacity.

The above preliminary study is summarized as follows. In the device 100, the first electrode region 5 having the high impurity concentration (i.e., N⁺) is formed in the intermediate concentration region 6, and the intermediate concentration region 6 having the intermediate impurity concentration (i.e., N) is formed in the low concentration region 1 having the low impurity concentration (i.e., N⁻). Accordingly, the device includes two different boundaries having an N—N junction and having different impurity concentration. One is the first boundary having the N⁻-N junction between the low concentration region 1 and the intermediate concentration region 6. The other is the second boundary having the N-N⁺ junction between the intermediate concentration region 6 and the first electrode region 5.

As described above preliminary study, a junction between two regions having different impurity concentration disposed at a drain is break down at certain current density and voltage, so that a generated hole causes an injection of an excessive electron injected from the source. The injection of the excessive electron causes a reduction of a drain voltage. Further, the injection of the excessive electrode increases the break-down of the junction. Therefore, a positive feedback works between the break-down of the junction and the injection of the excessive electron. Thus, the current is increased, and the voltage is decreased, so that the negative resistance part (i.e., a snap back effect) is provided. A break-down point is shown as a break point in a current-voltage characteristic. At the break point, the characteristic curve changes from the positive resistance part top the negative resistance part so that the gradient of the curve is drastically changed.

In the device 100, the first and second break points B1a–B1e, B2a–B2e are disposed in the curve a–e. When the first break point voltage Vb1 at the first break point B1a–B1e attributed to the first boundary J1 is equal to or smaller than the second break point voltage Vb2 at the second break point B2a–B2e attributed to the second boundary J2, the snap back effect at the first boundary J1 is suppressed by the existence of the second boundary J2. Thus, the negative resistance part caused by the first junction J1 is suppressed or disappears.

Figure 2A:
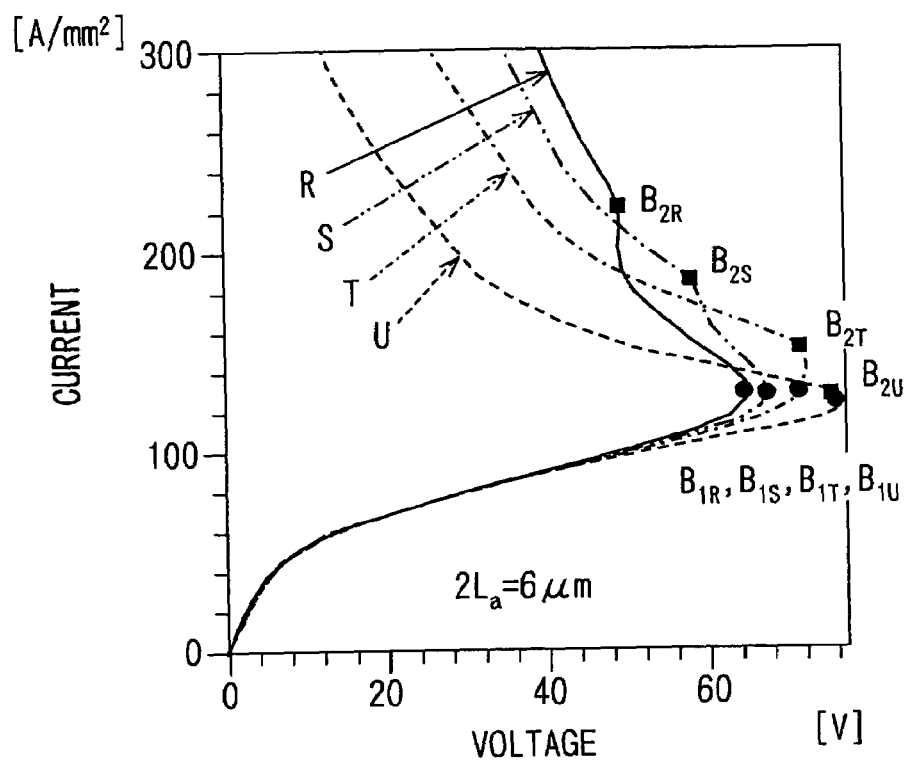
FIGS. 2A and 2B are graphs showing current-voltage characteristics of the device according to the first embodiment.
Figure 2B:
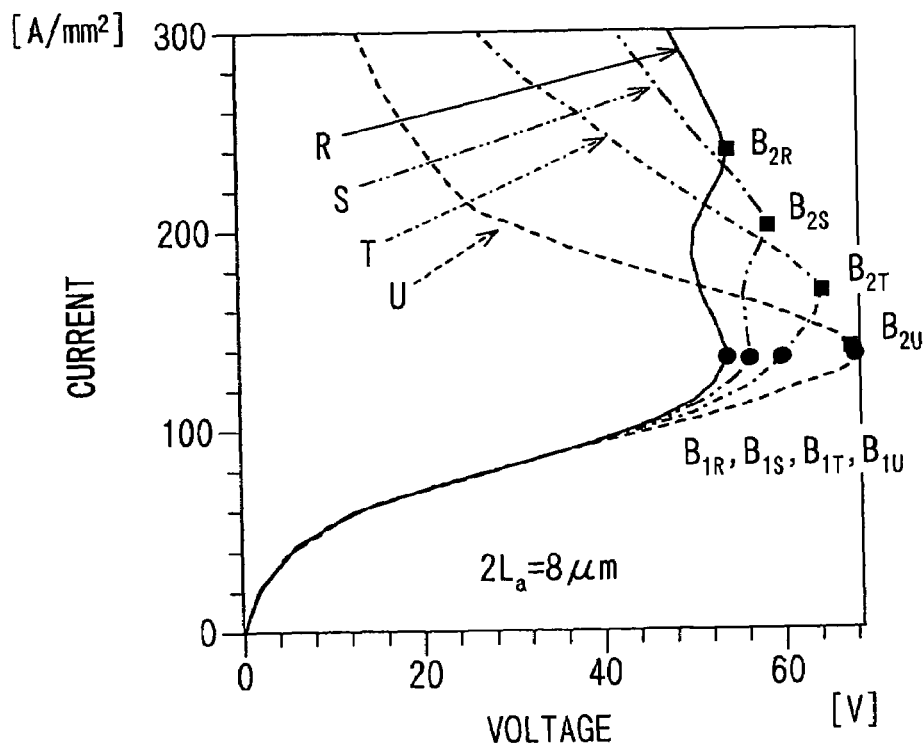

FIGS. 2A and 2B show a simulation result of the current-voltage characteristics in the device 100 having different surface impurity concentrations Nad of the intermediate concentration region 6 and different widths 2La of the intermediate concentration region 6. In FIG. 2A, the width 2La is set to be 6 μm. In FIG. 2B, the width 2La is set to be 8 μm. In FIGS. 2A and 2B, the surface impurity concentration Nad of the characteristic curve R is $1\times10^{17}/cm^3$, the surface impurity concentration Nad of the curve S is $0.8\times10^{17}/cm^3$, the curve T $0.6\times10^{17}/cm^3$, and the curve U $0.4\times10^{17}/cm^3$. Here, the impurity concentration Nsub of the low concentration region 1 is $10\times10^{15}/cm^3$, and each surface impurity concentration of the first and second electrode regions 5, 8 disposed near the upper surface is $1\times10^{20}/cm^3$, respectively.

As shown in FIGS. 2A and 2B, the first break point voltage Vb1 at the first break point B1R–B1U attributed to the first boundary J1 becomes larger, as the surface impurity concentration Nad of the intermediate concentration region 6 becomes small. However, the first break point current density Ib1 at the first break point B1R–B1U attributed to the first boundary J1 does not change substantially, when the surface impurity concentration Nad of the intermediate concentration region 6 becomes smaller. On the other hand, the second break point current density Ib2 at the second break point B2R–B2U attributed to the second boundary J2 becomes larger, as the surface impurity concentration Nad of the intermediate concentration region 6 becomes larger. Thus, the second break point current density Ib2 approaches the maximum surge current density per unit area Imax of 200 A/mm².

The second break point voltage Vb2 at the second break point B2R–B2U attributed to the second boundary J2 in FIG. 2A is much different from the second break point voltage Vb2 in FIG. 2B. In FIG. 2B, the width 2La is 8 μm, and the second break point voltage Vb2 becomes larger so that a current range satisfying the formula F2 becomes wider. Therefore, the negative resistance part is suppressed and reduced or disappears when a current density is equal to or lower than the second break point current density Ib2. Specifically, in the curves R, S, the difference between the first and second break point current densities Ib1, Ib2 is comparatively large, so that the device 100 can satisfy both of the formula F2 and the formula F3. Especially, in the curve S in FIG. 2B, the negative resistance part attributed to the first boundary J1 is almost completely suppressed (i.e., disappears) so that the negative resistance part does not exist between the first and second break points B1S, B2S. Here, the second break point B2S attributed to the second boundary J2 in FIG. 2B is about 200 A/mm².

Thus, the device 100 having an appropriate impurity concentration Nsub of the low concentration region 1, an appropriate surface impurity concentrations Nad of the intermediate concentration region 6 and an appropriate width 2La of the intermediate concentration region 6 satisfies the formulas F2 and F3, simultaneously. Thus, the negative resistance part between the first and second break points in the current-voltage characteristic curve is suppressed or disappears so that the device 100 has a high ESD surge withstand capacity.

In the method for designing the above device 100, the surface impurity concentration Nad and the width 2La of the intermediate concentration region 6 are defined. Here, the width 2La is the width of the opening of the mask used for forming the intermediate concentration region 6. Specifically, the mask is used in the ion implantation process for forming the intermediate concentration region 6. When the surface impurity concentration Nad and the width 2La are certain values, respectively, the device 100 can have a predetermined current-voltage characteristic. For example, the device 100 can have the current-voltage characteristic without the negative resistance part in the range under the current density of 200 A/mm².

Although the second electrode region 8 includes the N⁺ conductivity type impurity with the high impurity concentration, the second electrode region 8 can include the N conductivity type impurity with a different impurity concentration different from that of the low concentration region. Further, the second electrode region 8 can include a P conductivity type impurity.

Although the device 100 includes parts having the above conductivity type, all of the above conductivity types of the device 100 can be reversed. For example, the low concentration region, the intermediate concentration region 6 and the first and second electrode regions can have a P conductivity type.

(Second Embodiment)

In the device 100, a part of the characteristic curve a–e, R–U disposed in a range between a starting point and the first break point B1a–B1e, B1R–B1U can be used for operating as a resistor. Accordingly, the device 100 for operating as the resistor directly connects to another conventional transistor or the like so that the other conventional transistor works as a switching device and the device 100 works for absorbing the ESD surge. Thus, the device 100 with the other conventional transistor has the high ESD surge withstand capacity.

Figure 3A:
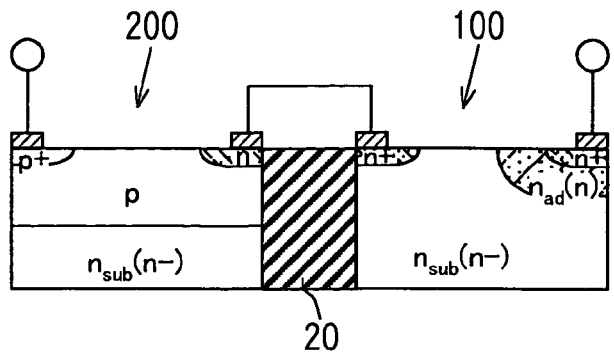
FIGS. 3A to 3D are cross sectional views showing the semiconductor device having various conventional electronic devices according to a second embodiment of the present invention.
Figure 3B:
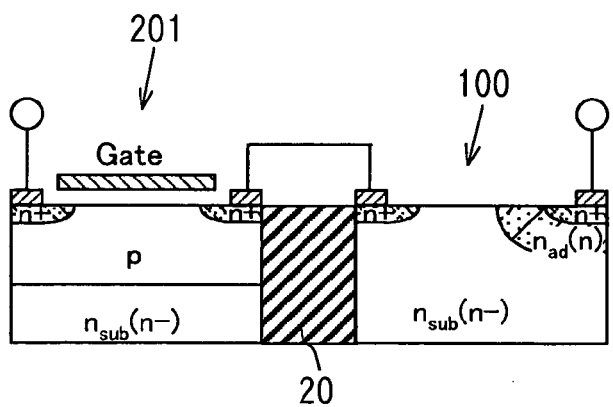
Figure 3C:
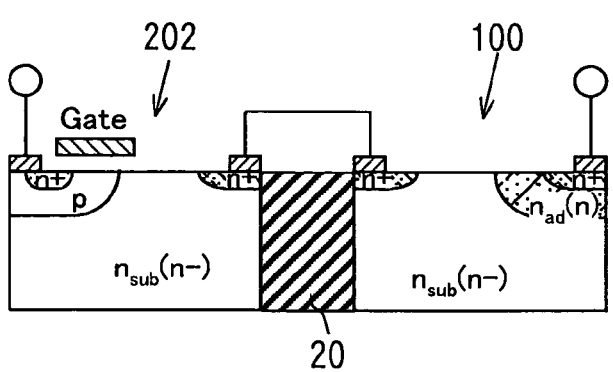
Figure 3D:
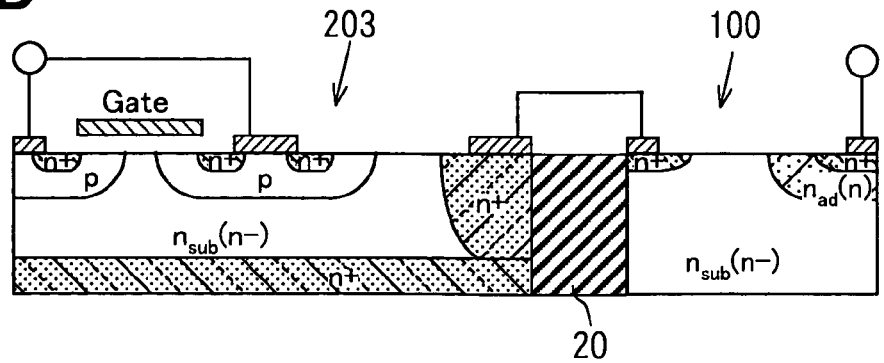

FIGS. 3A to 3D and 4A to 4C show the device 100 with the other conventional transistor or the like according to a second embodiment of the present invention. FIG. 3A shows the device 100 with a diode 200, which connects to the device 100 in series through an insulation region 20. FIG. 3B shows the device 100 with a MOS transistor 201, which connects to the device 100 in series through the insulation region 20. FIG. 3C shows the device 100 with a LDMOS transistor 202, which connects to the device 100 in series through the insulation region 20. FIG. 3D shows the device 100 with an UPDRAIN-DMOS (i.e., an up-drain diffused metal oxide semiconductor) transistor 203, which connects to the device 100 in series through the insulation region 20. The insulation region 20 separates the device 100 and the other conventional device 200203 such as the diode 200. The insulation region 20 is made of dielectric material. The device 100 can be separated from the other conventional device 200–203 with a PN junction separation method. Further, the device 100 and the other conventional device 200–203 can be formed on different substrates, respectively, so that they are connected each other in series.

Figure 4A:
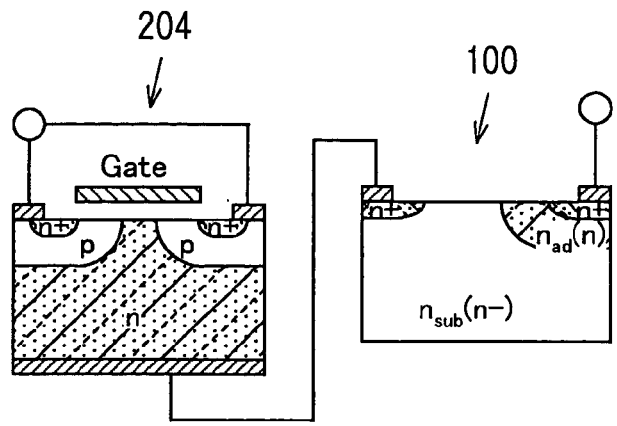
FIGS. 4A to 4C are cross sectional views showing the semiconductor device having various conventional electronic devices according to the second embodiment.
Figure 4B:
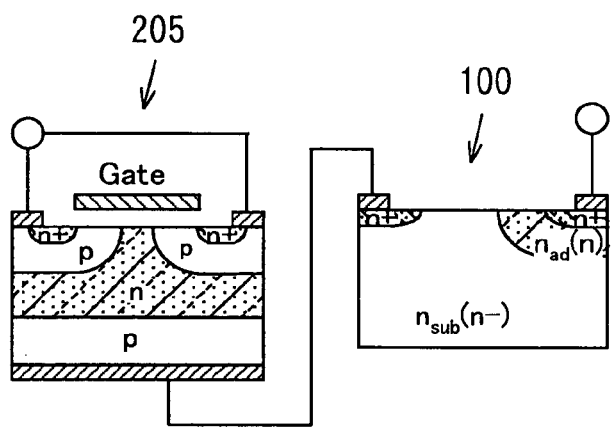
Figure 4C:
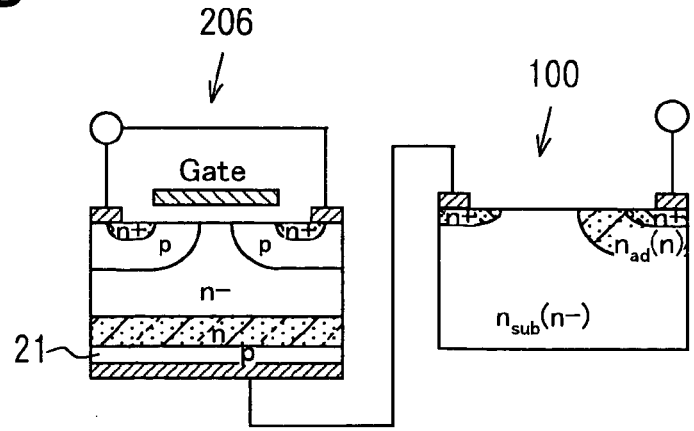

FIG. 4A shows the device 100 with a vertical type DMOS transistor 204, which connects to the device 100 in series. FIG. 4B shows the device 100 with an IGBT (insulated gate bipolar transistor) 205, which connects to the device 100 in series. FIG. 4C shows the device 100 with a FS-IGBT (i.e., field stop insulated gate bipolar transistor) 206, which connects to the device 100 in series. Here, a bottom P conductivity type layer 21 disposed in the FS-IGBT 206 has a thickness equal to or thinner than 2 μm. Each conventional device 204–206 has an electrode disposed on the bottom of a semiconductor substrate. Therefore, the device 100 and the conventional device 204–206 can be formed on different substrates, respectively, so that they are connected each other in series.

Figure 5A:
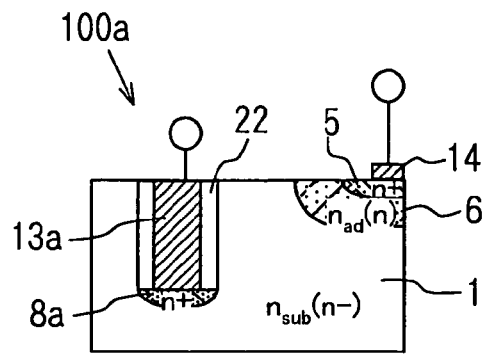
FIGS. 5A and 5B are cross sectional views showing a vertical type semiconductor device according to the second embodiment.
Figure 5B:
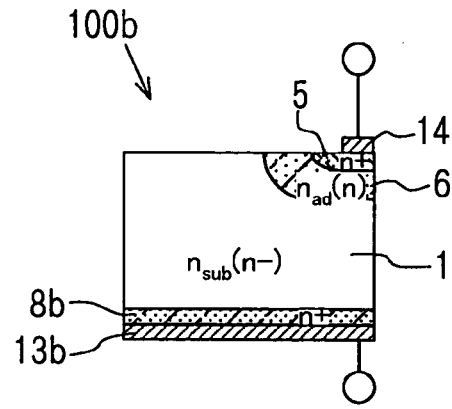
Figure 5C:
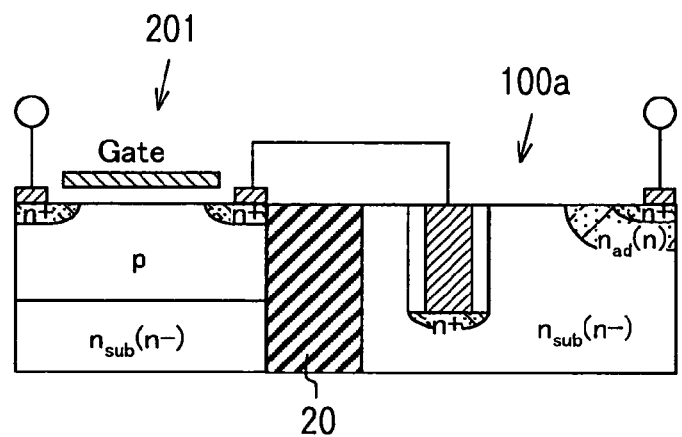
FIG. 5C is a cross sectional view showing the vertical type semiconductor device having a conventional electronic device according to the second embodiment.

In the device 100, the first electrode region 5 and the second electrode region 8 are formed on one surface of the semiconductor substrate so that the device 100 provides a lateral type semiconductor device. The device 100 can provide a vertical type semiconductor device. Specifically, the second electrode region 8 is formed inside of the semiconductor substrate or formed on the other surface of the semiconductor substrate, the other surface opposite to the one surface on which the first electrode region 5 is formed. FIGS. 5A to 5C show a vertical type semiconductor device 100a–100c. FIG. 5A shows the device 100a having the first terminal 14 and the second terminal 13a. A construction around the first terminal 14 in the device 100a is similar to that in the device 100 shown in FIG. 1A. However, in the device 100a, the second electrode region 13a having the high impurity concentration of the N conductivity type impurity is formed in the low concentration region 1. Specifically, the second terminal 13a is embedded in a trench formed on the surface of the semiconductor substrate so that the second terminal 13a connects to the second electrode region 8a with a sidewall insulation film 22.

The device 100b shown in FIG. 5B has the first terminal 14 and the second terminal 13b. The device 100b includes a semiconductor substrate having a low concentration region 1b having a low impurity concentration of the N conductivity type impurity. A construction around the first terminal 14 in the device 100b is similar to that in the device 100 shown in FIG. 1A. However, in the device 10b, the second electrode region 8b is formed on the other surface of the substrate. The other surface (i.e., the bottom surface) is opposite to the one surface (the top surface) of the substrate, on which the first electrode region 5 is formed. The second electrode region 8b includes a high impurity concentration of the N conductivity type impurity. The second terminal 13b connects to the second electrode region 8b on the bottom surface of the substrate.

In the above devices 100a, 100b, the negative resistance part can be narrowed so that the devices 100a, 100b have the high ESD surge withstand capacity.

FIG. 5C shows the device 100a with the MOS transistor 201, which connects to the device 100a in series through the insulation region 20.

Figure 6:
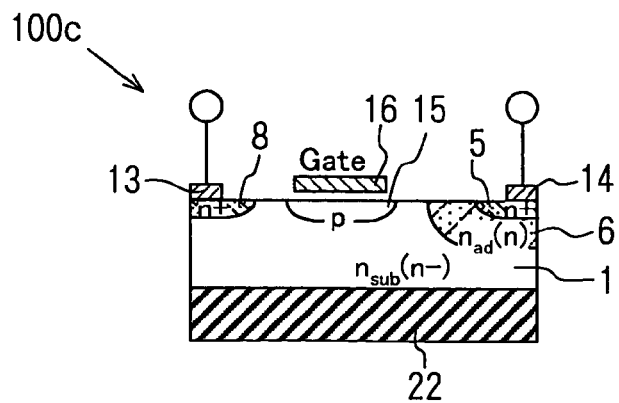
FIG. 6 is a cross sectional view showing a semiconductor device having a depression type J-FET according to the second embodiment.

Further, the device 100 shown in FIG. 1A can work as a resistor so that the device 100 provides a depression type J-FET (i.e., junction field effect transistor) having high ESD surge withstand capacity. FIG. 6 shows a semiconductor device 100c including the depression type J-FET provided by the device 100. In the device 100c, a P conductivity type region 15 is formed between the intermediate concentration region 6 and the second electrode region 8. A gate electrode 16 is formed on the P conductivity type region 15. The device 100c provides the depression type J-FET controlled by the gate electrode 16. In the device 100c, the negative resistance part can be narrowed so that the device 100c have the high ESD surge withstand capacity.

Although the device 100, 100a–100c and the other device 200–206 include parts having the above conductivity type, all of the above conductivity types of the device 100, 100a–100c and the other device 200–206 can be reversed.

(Third Embodiment)

Figure 7A:
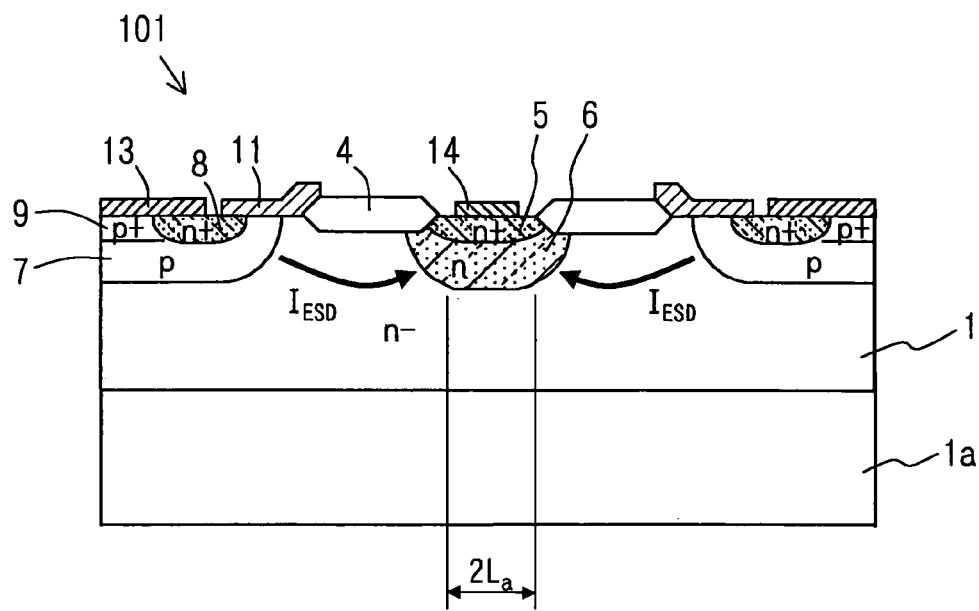
FIG. 7A is a cross sectional view showing a part of a semiconductor device including a LDMOS transistor according to a third embodiment of the present invention.
Figure 7B:
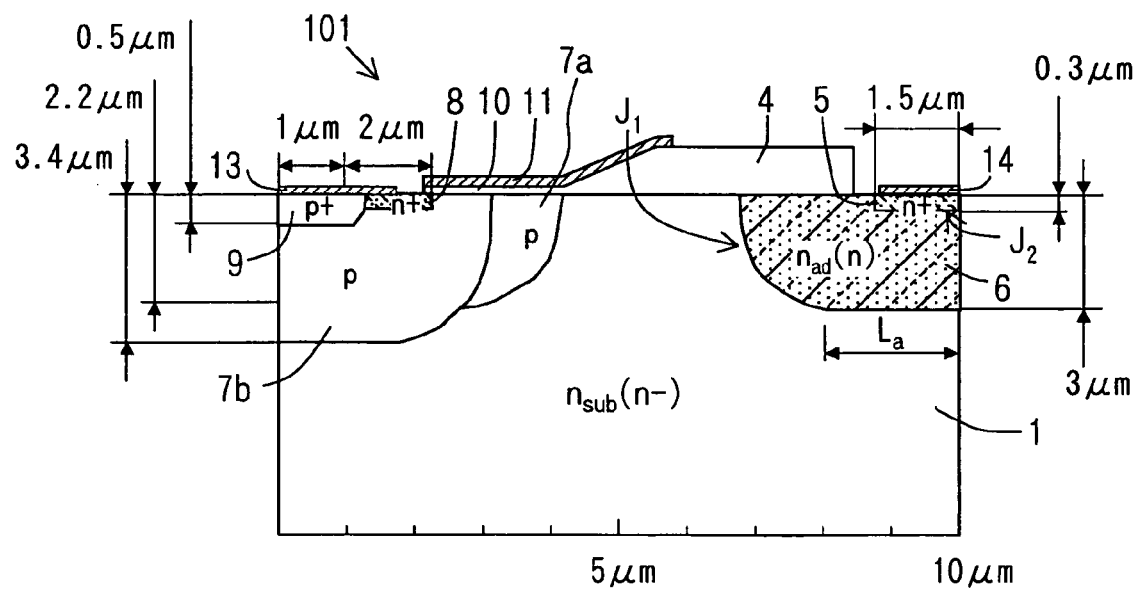
FIG. 7B is a cross sectional view showing a simulation model of the device shown in FIG. 7A.

Another semiconductor device 101 according to a third embodiment of the present invention is shown in FIGS. 7A and 7B. The device 101 includes a LDMOS transistor. FIG. 7A shows an actual device 101, and FIG. 7B shows a simulation model of the device 101. In the device 101 shown in FIGS. 7A and 7B, the LDMOS transistor includes the intermediate concentration region 6. FIG. 7A shows two cells of the LDMOS transistor. Specifically, one cell shown in FIG. 7B and another cell obtained by horizontally inversing the one cell shown in FIG. 7B provide two cells shown in FIG. 7A. In the actual LDMOS transistor 101, the one cell shown in FIG. 7B and the other cell, which is provided by reversing the one cell horizontally, are alternately repeated. That is, the one cell and the other cell are symmetrically and alternately disposed in the LDMOS transistor 101. A base substrate 1a is disposed under the low concentration region 1. The base substrate 1a corresponds to the combination of the P conductivity type silicon substrate 2 and the insulation layer 3 shown in FIG. 1A. The base substrate 1a can have another construction. When the ESD surge is applied to the LDMOS transistor 101, and the positive voltage is applied to the drain electrode 14, a large ESD surge current Iesd flows from the source electrode 13 and the drain electrode 14, as shown in FIG. 7A.

In the simulation model of the device 101 shown in FIG. 7B, the second electrode region 8 is formed in two P conductivity type regions 7a, 7b. The P conductivity type regions 7a, 7b are formed in the low concentration region 1. The LDMOS transistor in the device 101 has a diffused construction including the P conductivity type region 7a as a channel and the second electrode region 8 as a source. This diffused construction is a basic structure of the LDMOS transistor. The impurity concentration of the P conductivity type region 7a is $1.5 \times 10^{17}/\text{cm}^3$. The boundary edge between the P conductivity type region 7a and the low concentration region 1 is disposed at the boundary between the gate electrode 11 and the LOCOS region 4. The impurity concentration of the P conductivity type region 7b is $6 \times 10^{17}/\text{cm}^3$. The impurity concentration of the $P^+$ conductivity type contact region 9 is $1 \times 10^{20}/\text{cm}^3$. Each impurity concentration of the first and second electrode regions 5, 8 having the N conductivity type impurity is $1 \times 10^{20}/\text{cm}^3$. The $P^+$ conductivity type contact region 9 has a width of 1 μm and a thickness of 0.5 μm. The second electrode region 8 has a width of 2 μm. The P conductivity type region 7a has a depth of 2.2 μm. The P conductivity type region 7b has a depth of 3.4 μm. The first electrode region 5 has a width of 1.5 μm and a thickness of 0.3 μm. The intermediate concentration region 6 has a depth of 3 μm and a width of 2La.

Figure 8:
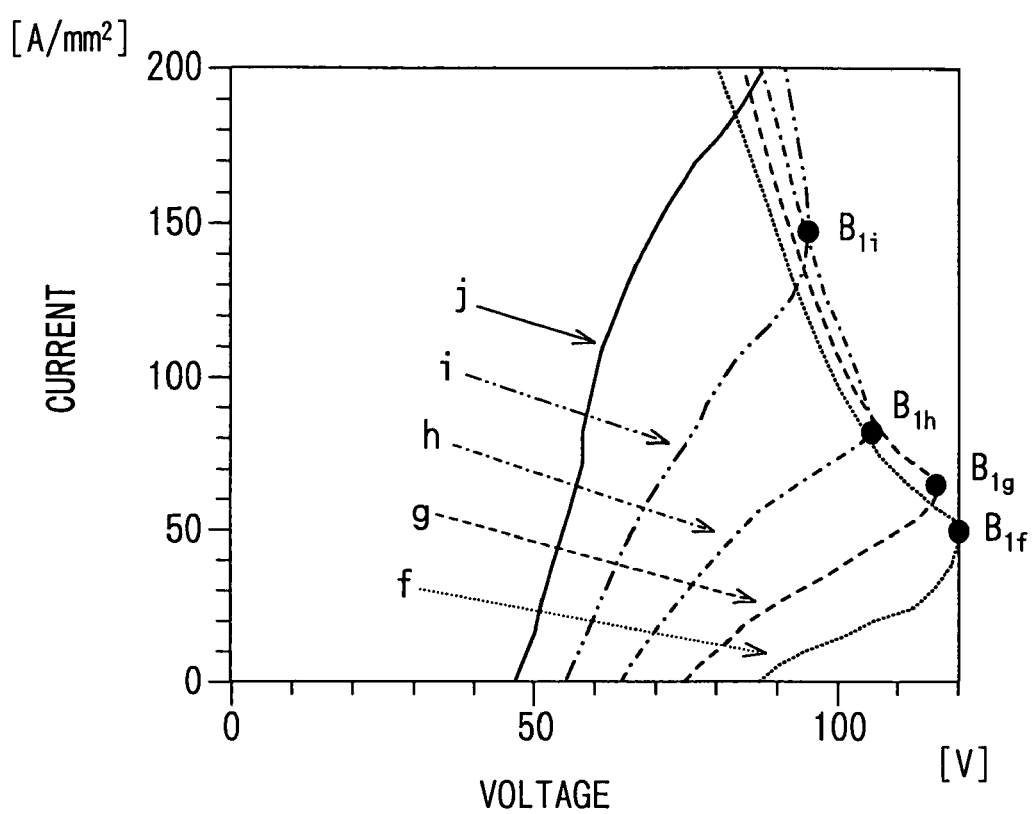
FIG. 8 is a graph showing current-voltage characteristics of the device according to the third embodiment.

FIG. 8 shows a simulation result of current-voltage characteristics of the device 101. Specifically, in the device 101, different impurity concentrations Nsub of the low concentration region 1 are tested. In the characteristic curve f, the impurity concentration Nsub is $4 \times 10^{15}/\text{cm}^3$, the impurity concentration of the curve g is $6 \times 10^{15}/\text{cm}^3$, the curve h $9 \times 10^{15}/\text{cm}^3$, the curve i $13.5 \times 10^{15}/\text{cm}^3$, and the curve j $20 \times 10^{15}/\text{cm}^3$. Here, the surface impurity concentration Nad of the intermediate concentration region 6 disposed near the first electrode region 5 is $5 \times 10^{17}/\text{cm}^3$. The width 2La of the intermediate concentration region 6 is set to be 6 μm.

In each characteristic curve f–i, a break point (i.e., a bending point) B1f–B1i appears. The break point B1f–B1i is attributed to the first boundary J1 disposed between the low concentration region 1 and the intermediate concentration region 6. Here, the break point B1j in the curve j is disposed upside of the drawing in FIG. 8. As shown in FIG. 8, in the device 101, each break point current Ib1f–Ib1i at the first break point B1f–B1i becomes larger as the impurity concentration of the low concentration region 1 becomes higher. Each break point voltage Vb1f–Vb1i at the first break point B1f–B1i becomes smaller as the impurity concentration of the low concentration region 1 becomes higher. This is because a withstand voltage of a PN junction formed between the P conductivity type region 7a, 7b and the low concentration region 1 in the device 101 becomes smaller as the impurity concentration of the low concentration region 1 becomes higher. The withstand voltage of the P-N junction is defined as a starting voltage (i.e., a rising voltage) in each curve f–j. The starting voltage is defined when a current begins to flow, the starting voltage is an intercept of the horizontal axis. For example, the starting voltage of the curve J is about 47V.

When the withstand voltage is about 40V, the impurity concentration of the low concentration region 1 in the device 101 can be increased up to $20\times10^{15}/cm^3$. In this case (i.e., in the curve j), the break point attributed to the first boundary J1 exceeds the maximum surge current density per unit area Imax of 200 A/mm². Thus, the snap back of voltage is not appeared in the range between 0 A/mm² and 200 A/mm² (i.e., in a range under 200 A/mm²).

However, to obtain the withstand voltage of 60V, the impurity concentration of the low concentration region 1 in the device 101 is required to be equal to or smaller than $10\times10^{15}/cm^3$. In this case (i.e., between the curve h and the curve i), the break point attributed to the first boundary J1 is lower than the maximum surge current density per unit area Imax of 200 A/mm². Thus, the snap back of voltage is appeared in the range over the break point.

FIGS. 9A, 9B, 10A and 10B show simulation results of the current-voltage characteristics in the device 101 having different surface impurity concentrations Nad of the intermediate concentration region 6 and different widths 2La of the intermediate concentration region 6. In FIGS. 9A, 9B, 10A and 10B, the impurity concentration of the low concentration region 1 is set to be $1\times10^{16}/cm^3$ so that the withstand voltage of 60V is obtained.

In FIGS. 9A, 9B, 10A and 10B, the device 101 has different widths 2La of the intermediate concentration region 6 among 4 μm, 6 μm, 8 μm, and 10 μm, respectively. In each drawing of FIGS. 9A, 9B, 10A and 10B, the device 101 has different surface impurity concentrations Nad of the intermediate concentration region 6. The surface impurity concentration Nad of the characteristic curve A is $4\times10^{17}/cm^3$, the surface impurity concentration Nad of the curve B is $2\times10^{17}/cm^3$, the curve C $1\times10^{17}/cm^3$, the curve D $0.5\times10^{17}/cm^3$, and the curve E $0.25\times10^{17}/cm^3$.

Figure 9A:
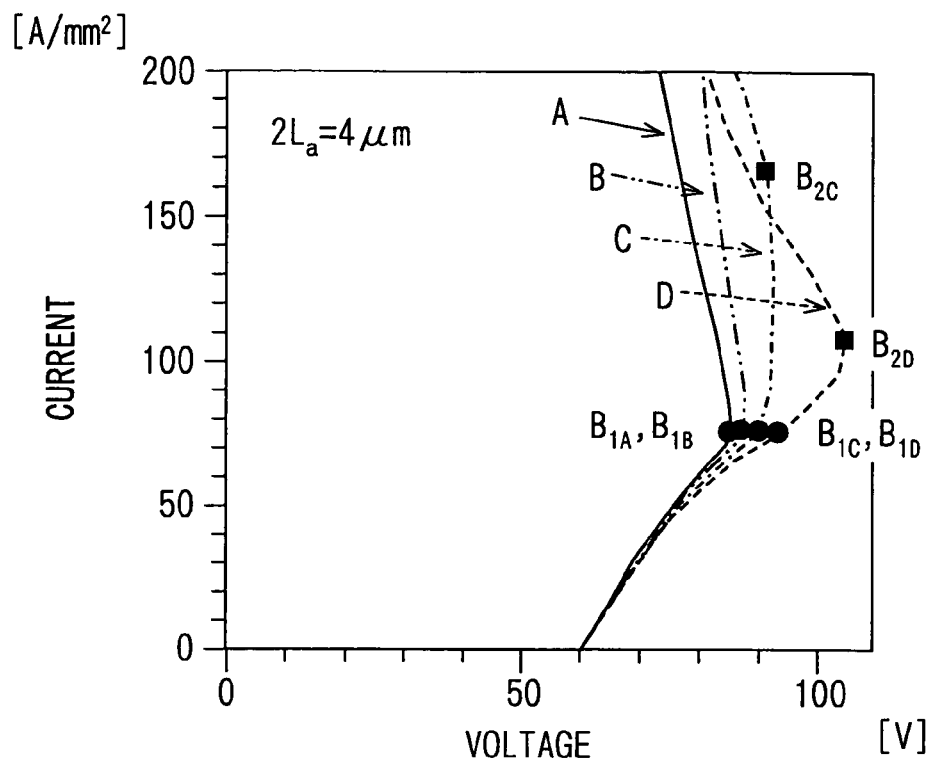
FIGS. 9A and 9B are graphs showing current-voltage characteristics of the device according to the third embodiment.

FIG. 9A shows the device 101, in which the width 2La of the intermediate concentration region 6 is 4 μm. In each curve A–D in FIG. 9A, a break point B1A–B1D attributed to the first boundary J1 between the low concentration region 1 and the intermediate concentration region 6 appears in a range under the current density of 200 A/mm². Further, in the curves C and D in FIG. 9A, the second break points B2C, B2D attributed to the second boundary J2 between the intermediate concentration region 6 and the first electrode region 5 appear in a range under the current density of 200 A/mm². Here, the second break points B2A, B2B in the curves A and B are disposed over the drawing (i.e., disposed in a range over the current density of 200 A/mm²).

When the maximum current density Imax is set to be 200 A/mm², each curve A–D has the negative resistance part in a range under the maximum current density Imax of 200 A/mm². The maximum current density Imax is the maximum current flowing between the first terminal 14 and the second terminal 13 when the ESD surge is applied to the device 101. When the device 101 is used for an automotive vehicle, it is required for the maximum current density Imax to be 200 A/mm². When the negative resistance part exists in the curve A–D, and in a case where the device area of the device 101 is equal to or smaller than 1 mm², the ESD surge current concentrates into a local portion of the device 101. Accordingly, the device 101 may fail. Therefore, the device 101 having the width 2La of 4 μm shown in FIG. 9A is not available for the vehicle.

Figure 9B:
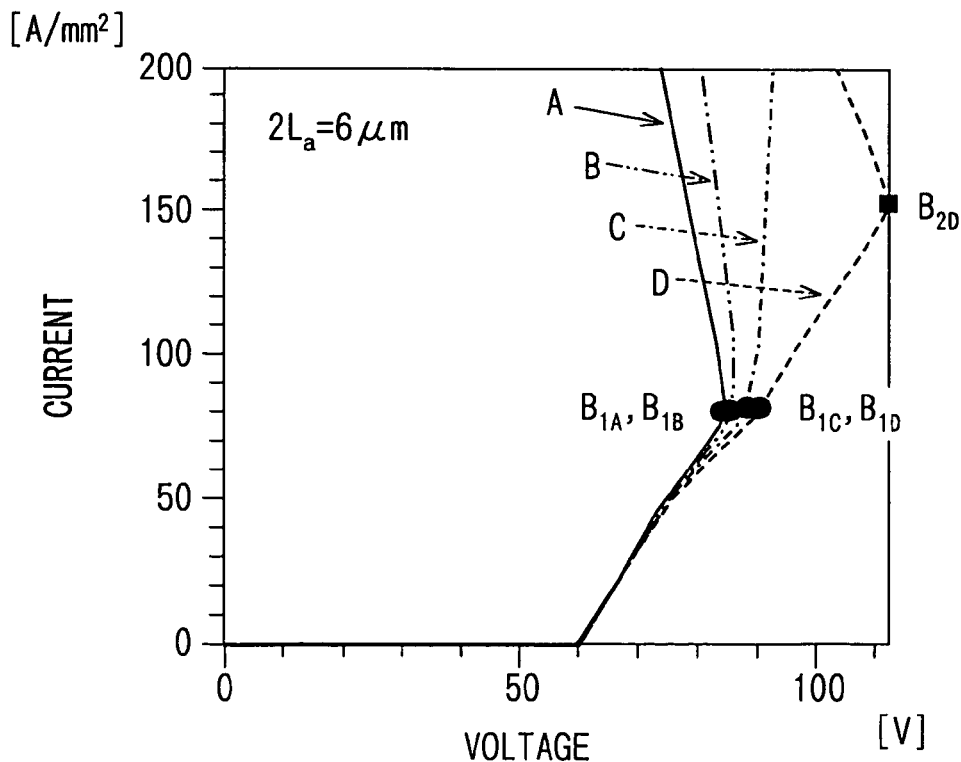

FIG. 9B shows the device 101, in which the width 2La of the intermediate concentration region 6 is 6 μm. In each curve A–D in FIG. 9B, a break point B1A–B1D attributed to the first boundary J1 appears in a range under the current density of 200 A/mm². Further, only in the curve D in FIG. 9B, the second break point B2D attributed to the second boundary J2 appears in the range under the current density of 200 A/mm². Here, the second break points B2A–B2C in the curves A to C are disposed over the drawing (i.e., disposed in a range over the current density of 200 A/mm²).

As shown in FIG. 9B, only in the curve C, the negative resistance part is not appeared in the range under the current density of 200 A/mm². In the curve C, the ESD surge is applied to the device 101, so that a current breakdown is occurred at the first boundary J1. Then, excessive carriers are injected (i.e., concentrated) at the first boundary J1. However, in the curve C, a voltage rise according to the surface impurity concentration Nad and the width 2La of the intermediate concentration region 6 is larger than the voltage drop according to the negative resistance effect. Thus, the curve C does not have the negative resistance part. Therefore, in case of the curve C, the negative resistance part does not appear, so that the snap back of voltage is suppressed in a case where the ESD surge is applied to the device 101. Thus, the current concentration (i.e., the current breakdown) is limited so that the device is protected from failing. Thus, the curve C is a preferable characteristic for the device 101.

Figure 10A:
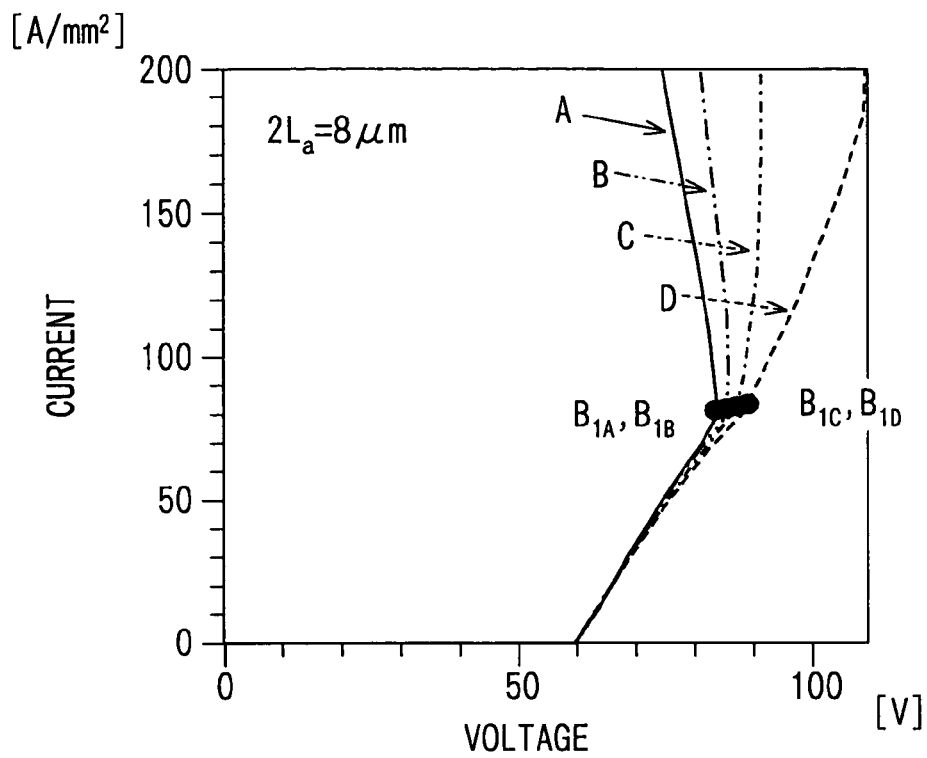
FIGS. 10A and 10B are graphs showing current-voltage characteristics of the device according to the third embodiment.

FIG. 10A shows the device 101, in which the width 2La of the intermediate concentration region 6 is 8 μm. In each curve A–D in FIG. 10A, the second break point B2A–B2D attributed to the second boundary J2 does not appear in a range under the current density of 200 A/mm². The second break points B2A–B2D in the curves A to D are disposed over the drawing (i.e., disposed in a range over the current density of 200 A/mm²). In the curves C and D, the negative resistance part is not appeared in the range under the current density of 200 A/mm². Therefore, in case of the curves C and D, the snap back of voltage is suppressed when the ESD surge is applied to the device 101 so that the device is protected from failing. Thus, the curves C and D are preferable for the device 101.

Figure 10B:
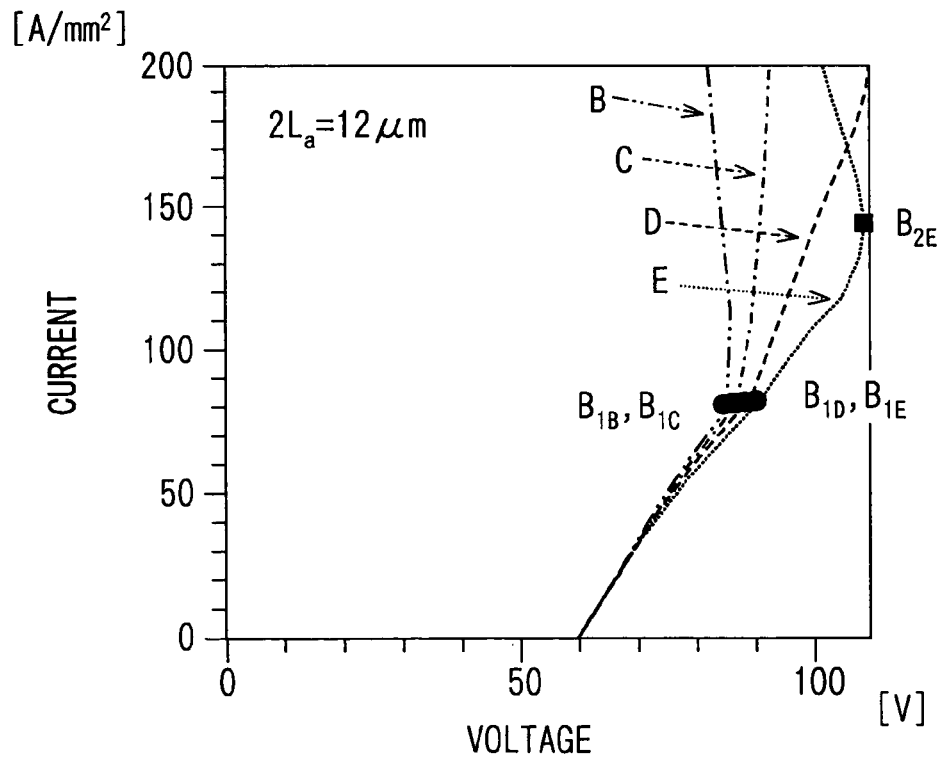

FIG. 10B shows the device 101, in which the width 2La of the intermediate concentration region 6 is 12 μm. In each curve B-D in FIG. 10B, the second break point B2B–B2D attributed to the second boundary J2 does not appear in a range under the current density of 200 A/mm². However, only in the curve E in FIG. 10B, the second break point B2E attributed to the second boundary J2 appears in the range under the current density of 200 A/mm². Here, the curve E represents the device 101 having the low surface impurity concentration of the intermediate concentration region 6. Thus, in the curve E, the negative resistance part appears in the range under current density of 200 A/mm². In the curves C and D, the negative resistance part is not appeared in the range under the current density of 200 A/mm². Therefore, in case of the curves C and D, the device is protected from failing so that the curves C and D are preferable for the device 101.

The above results are summarized as follows.

When the device 101 has the characteristic curves A and B, i.e., when the device 101 has the comparatively high surface impurity concentration of the intermediate concentration region 6, only the first break point B1A, B1B appears in the range under the current density of 200 A/mm² in each case where the width 2La of the intermediate concentration region 6 is 4 μm, 6 μm, 8 μm, or 12 μm. Thus, the second break point B2A, B2B does not appear in the range under the current density of 200 A/cm². Each curve A, B has the negative resistance part in a range over the first break point B1A, B1B.

When the device 101 has the characteristic curves C and D, i.e., when the device 101 has the comparatively low surface impurity concentration of the intermediate concentration region 6, the second break point B2C, B2D appears in the range under the current density of 200 A/mm² in a case where the width 2La of the intermediate concentration region 6 is 4 µm. Each curve C, D has the positive resistance part in a range over the first break point B1C, B1D. However, each curve C, D has the negative resistance part in a range over the second break point B2C, B2D. In a case where the width 2La of the intermediate concentration region 6 is equal to or larger than 6 µm, in the curve C, the negative resistance part does not appear in the range under the current density of 200 A/mm². In a case where the width 2La of the intermediate concentration region 6 is equal to or larger than 8 µm, in the curve D, the negative resistance part does not appear in the range under the current density of 200 A/mm².

When the device 101 has the characteristic curve E, i.e., when the device 101 has the lowest surface impurity concentration of the intermediate concentration region 6, the second break point B2E appears in the range under the current density of 200 A/mm² even in a case where the width 2La of the intermediate concentration region 6 is 12 µm.

Figure 11:
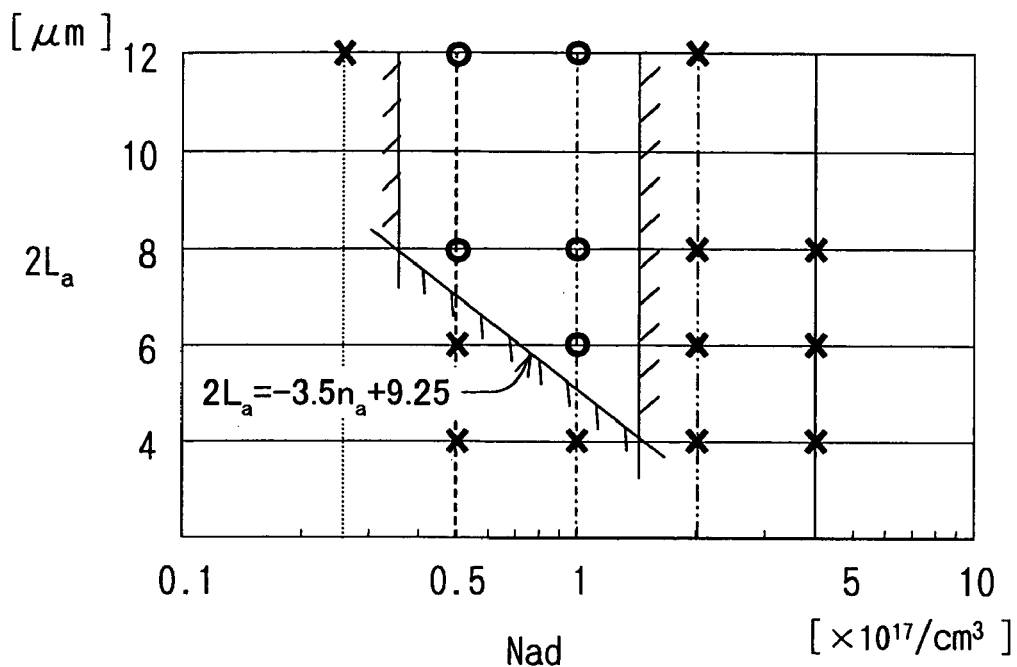
FIG. 11 is a graph showing simulation results, according to the third embodiment.

FIG. 11 shows a summary of the simulation results shown in FIGS. 9A to 10B. In FIG. 11, the vertical axis represents the width 2La of the intermediate concentration region 6. The horizontal axis represents the surface impurity concentration Nad of the intermediate concentration region 6. A circle (i.e., 0) represents the device 101 having no negative resistance part in the range under the current density of 200 A/mm². A cross (i.e., X) represents the device 101 having the negative resistance part in the range under the current density of 200 A/mm².

In FIG. 11, when the device 101 is disposed in a portion surrounded by a shadow, i.e., the portion including the circles, the negative resistance part does not appear in the current-voltage characteristic curve in the range under the current density of 200 A/mm². Therefore, when the ESD surge current is applied to the device 101, specifically, even when the maximum ESD surge current density Imax of 200 A/mm² is applied to the device 101, the current concentration according to the snap back effect is prevented so that the device 101 has high withstand capacity against the ESD surge. Here, the portion including the circles is shown as the following formulas.

(F4) $0.375 < Nad < 1.5$ (F5) $2La > -3.5 \times Nad \div 10^{17} + 9.25$

Thus, the device 101 having the surface impurity concentration Nad and the width 2La of the intermediate concentration region 6 limited in the above formula's range has high ESD surge withstand capacity.

In the method for designing the above device 101, the surface impurity concentration Nad and the width 2La of the intermediate concentration region 6 are defined. Here, the width 2La is the width of the opening of the mask used for forming the intermediate concentration region 6. Specifically, the mask is used in the ion implantation process for forming the intermediate concentration region 6. When the surface impurity concentration Nad and the width 2La are certain values, the device 101 can have a predetermined current-voltage characteristic. For example, the device 101 can have the current-voltage characteristic without the negative resistance part in the range under the current density of 200 A/mm².

Here, the surface impurity concentration Nad of the intermediate concentration region 6 and the width 2La of the opening of the mask in the ion implantation process are designed to satisfy the formulas F4 and F5, the device 101 has no negative resistance part in the current-voltage characteristic in the range under the current density of 200 A/mm².

Further, by defining the impurity concentration Nsub of the low concentration region 1, the device 101 can have a predetermined withstand voltage. For example, when the impurity concentration Nsub of the low concentration region 1 is designed to be equal to or lower than $20 \times 10^{15}/cm^3$, the device 101 has the withstand voltage of 40V. Further, when the impurity concentration Nsub of the low concentration region 1 is designed to be equal to or lower than $10 \times 10^{15}/cm^3$, the device 101 has the withstand voltage of 60V.

Although the device 101 includes parts having the above conductivity type, all of the above conductivity types of the device 101 can be reversed.

(Fourth Embodiment)

The device 100 shown in FIG. 1A has a diode type construction, and the device 101 shown in FIG. 7A has a LDMOS transistor. However, the above methods for designing the device can be used for another semiconductor device having the low concentration region 1, the intermediate concentration region 6 and the first electrode region 5, in which the impurity concentrations of the N conductivity type impurity become higher in this order.

Figure 12:
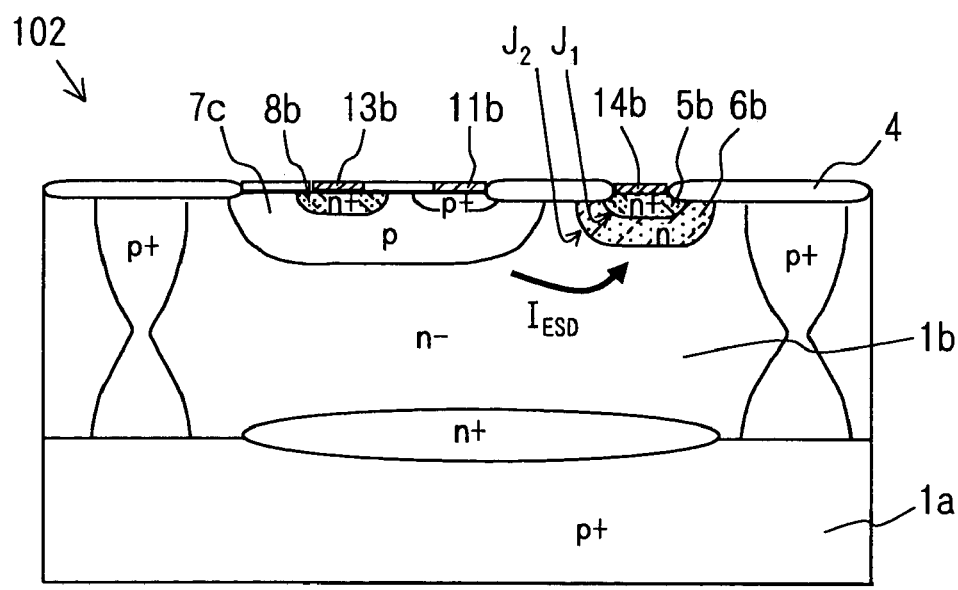
FIG. 12 is a cross sectional view showing a semiconductor device including a bipolar transistor according to a fourth embodiment of the present invention.

FIG. 12 shows another semiconductor device 102 according to a fourth embodiment of the present invention. The device 102 includes a bipolar transistor, which is, for example, N-P-N type transistor. The transistor includes a base electrode 11b, a collector electrode 14b corresponding to the first terminal 14 in FIG. 1A, and an emitter electrode 13b corresponding to the second terminal 13. In the transistor, the second electrode region 8b as an emitter is formed in a P conductivity type region 7c as a base. A collector structure is formed around the collector electrode 14b. The collector structure is composed of a low concentration region 1b, an intermediate concentration region 6b and the first electrode region 5b, in which the impurity concentrations of the N conductivity type impurity become higher in this order. Accordingly, the device 102 has a similar construction of the device 101 having the LDMOS transistor. Therefore, the device 102 having the bipolar transistor can be designed by the same manner as the device 101. Thus, the device 102 has high ESD surge withstand capacity.

Although the device 102 includes parts having the above conductivity type, all of the above conductivity types of the device 102 can be reversed.

Such changes and modifications are to be understood as being within the scope of the present invention as defined by the appended claims.

What is claimed is:
1. A semiconductor device comprising:
a semiconductor substrate;
a low concentration region disposed in the substrate and including a first conductivity type impurity with a low impurity concentration;
an intermediate concentration region disposed in the low concentration region and including the first conductivity type impurity with an intermediate impurity concentration;

a first electrode region disposed in the intermediate concentration region and including the first conductivity type impurity with a high impurity concentration; and
a second electrode region disposed in the low concentration region and including the first conductivity type impurity with an impurity concentration different from the low impurity concentration of the low concentration region,
wherein the low concentration region and the intermediate concentration region provide a first boundary therebetween,
wherein the intermediate concentration region and the first electrode region provide a second boundary therebetween,
wherein the device has a current-voltage characteristic associated with a predetermined relationship between a current in the first electrode region and a voltage between the first and second electrode regions,
wherein the current-voltage characteristic includes a first break point attributed to the first boundary and a second break point attributed to the second boundary,
wherein the first break point has a voltage, which is equal to or smaller than another voltage of the second break point,
wherein the device has a maximum current density flowing between the first and second electrode regions when the device is applied with an electrostatic discharge surge,
wherein the first break point has a current density, which is smaller than the maximum current density, and
wherein the second break point has another current density, which is larger than the maximum current density.

2. The device according to claim 1, further comprising:
a first terminal disposed on the substrate and connecting to the first electrode region; and
a second terminal disposed on the substrate and connecting to the second electrode region,
wherein the semiconductor substrate includes a surface portion,
wherein the low concentration region is disposed in the surface portion of the substrate,
wherein the device has the current-voltage characteristic through the first and second terminals, and
wherein the current-voltage characteristic is drastically changed at the first and second break points.

3. The device according to claim 1,
wherein the maximum current density is equal to 200 A/mm$_2$.

4. The device according to claim 1,
wherein the device is used for an automotive vehicle.

5. The device according to claim 1,
wherein the intermediate impurity concentration of the intermediate concentration region is equal to or larger than $0.8 \times 10^{17}/cm^3$,
wherein the intermediate concentration region has a width, which is determined by an opening width of a mask for forming the intermediate concentration region, and
wherein the width of the intermediate concentration region is equal to or larger than 8 μm.

6. The device according to claim 1,
wherein the second electrode region includes the first conductivity type impurity with a high impurity concentration, and
wherein the device is connected in series with a diode, a metal oxide semiconductor transistor, a lateral diffused metal oxide semiconductor transistor, a vertical type diffused metal oxide semiconductor transistor, an up-drain diffused metal oxide semiconductor transistor, an insulated gate bipolar transistor or a field stop insulated gate bipolar transistor.

7. The device according to claim 1,
wherein the device is a controller for controlling an electric power.

8. The device according to claim 1,
wherein the first conductivity type is an N conductivity type.

9. The device according to claim 1, further comprising:
a second conductivity type region having a second conductivity type impurity and disposed in the substrate between the intermediate concentration region and the second electrode region,
wherein the second electrode region includes the first conductivity type impurity with a high impurity concentration, and
wherein the device is a depression type junction field effect transistor, which is controlled by a gate electrode disposed on the second conductivity type region.

10. The device according to claim 9,
wherein the first conductivity type is an N conductivity type, and
wherein the second conductivity type is a P conductivity type.

11. The device according to claim 1, further comprising:
a first terminal disposed on the substrate and connecting to the first electrode region; and
a second terminal disposed in a trench in the low concentration region,
wherein the second electrode region is disposed in a bottom of the trench so that the second electrode connects to the second terminal, and
wherein the device is a vertical type semiconductor device.

12. The device according to claim 11,
wherein the second electrode region includes the first conductivity type impurity with a high impurity concentration, and
wherein the device is connected in series with a diode, a metal oxide semiconductor transistor, a lateral diffused metal oxide semiconductor transistor, a vertical type diffused metal oxide semiconductor transistor, an up-drain diffused metal oxide semiconductor transistor, an insulated gate bipolar transistor or a field stop insulated gate bipolar transistor.

13. The device according to claim 1, further comprising:
a first terminal disposed on the substrate and connecting to the first electrode region; and
a second terminal,
wherein the first electrode region and the intermediate concentration region are disposed in one surface portion of the substrate,
wherein the second electrode region is disposed in the other surface portion of the substrate, which is opposite to the one surface portion of the substrate,
wherein the second terminal is disposed on the second electrode region, and
wherein the device is a vertical type semiconductor device.

14. A semiconductor device comprising:
a semiconductor substrate;
a low concentration region disposed in the substrate and including a first conductivity type impurity with a low impurity concentration;

an intermediate concentration region disposed in the low concentration region and including the first conductivity type impurity with an intermediate impurity concentration;
a second conductivity type region having a second conductivity type impurity and disposed in the low concentration region,
a first electrode region disposed in the intermediate concentration region and including the first conductivity type impurity with a high impurity concentration; and
a second electrode region disposed in the low concentration region and including the first conductivity type impurity with an impurity concentration different from the low impurity concentration of the low concentration region,
wherein the low concentration region and the intermediate concentration region provide a first boundary therebetween,
wherein the intermediate concentration region and the first electrode region provide a second boundary therebetween,
wherein the device has a current-voltage characteristic associated with a predetermined relationship between a current in the first electrode region and a voltage between the first and second electrode regions,
wherein the current-voltage characteristic includes a first break point attributed to the first boundary and a second break point attributed to the second boundary,
wherein the first break point has a voltage, which is equal to or smaller than another voltage of the second break point,
wherein the device has a maximum current density flowing between the first and second electrode regions when the device is applied with an electrostatic discharge surge,
wherein the first break point has a current density, which is smaller than the maximum current density, and
wherein the second break point has another current density, which is larger than the maximum current density.

15. The device according to claim 14,
wherein the impurity concentration of the low concentration region is equal to or lower than $20 \times 10^{15}/cm^3$.

16. The device according to claim 15,
wherein the impurity concentration of the low concentration region is equal to or lower than $10 \times 10^{15}/cm^3$.

17. The device according to claim 14,
wherein the intermediate concentration region has a surface impurity concentration defined as Nad,
wherein the intermediate concentration region has a width defined as 2La, the width determined by an opening width of a mask for forming the intermediate concentration region,
wherein the surface impurity concentration of the intermediate concentration region is larger than $0.375 \times 10^{17}/cm^3$, and is smaller than $1.5 \times 10^{17}/cm^3$, and
wherein the surface impurity concentration and the width of the intermediate concentration region have a relationship as:

$$2La > -3.5 \times Nad \div 10^{17} + 9.25.$$

18. The device according to claim 14, further comprising:
a gate electrode disposed on the second electrode region and on the second conductivity type region;
a drain electrode disposed on the first electrode region; and
a source electrode disposed on the second electrode region,
wherein the device is a lateral diffused metal oxide semiconductor transistor.

19. The device according to claim 14, further comprising:
a base electrode disposed on the second conductivity type region;
a collector electrode disposed on the first electrode region; and
an emitter electrode disposed on the second electrode region,
wherein the device is a bipolar transistor.

20. The device according to claim 14,
wherein the first conductivity type is an N conductivity type, and
wherein the second conductivity type is a P conductivity type.

21. The device according to claim 14, further comprising:
a first terminal disposed on the substrate and connecting to the first electrode region; and
a second terminal disposed on the substrate and connecting to the second electrode region,
wherein the semiconductor substrate includes a surface portion,
wherein the low concentration region is disposed in the surface portion of the substrate,
wherein the device has the current-voltage characteristic through the first and second terminals, and
wherein the current-voltage characteristic is drastically changed at the first and second break points.

22. The device according to claim 14,
wherein the maximum current density is equal to 200 A/mm$^2$.

23. The device according to claim 14,
wherein the device is used for an automotive vehicle.

24. A semiconductor device comprising:
a semiconductor substrate;
a low concentration region disposed in the substrate and including a first conductivity type impurity with a low impurity concentration;
an intermediate concentration region disposed in the low concentration region and including the first conductivity type impurity with an intermediate impurity concentration;
a first electrode region disposed in the intermediate concentration region and including the first conductivity type impurity with a high impurity concentration; and
a second electrode region disposed in the low concentration region and including a second conductivity type impurity,
wherein the low concentration region and the intermediate concentration region provide a first boundary therebetween,
wherein the intermediate concentration region and the first electrode region provide a second boundary therebetween,
wherein the device has a current-voltage characteristic associated with a predetermined relationship between a current in the first electrode region and a voltage between the first and second electrode regions,
wherein the current-voltage characteristic includes a first break point attributed to the first boundary and a second break point attributed to the second boundary, wherein the first break point has a voltage, which is equal to or smaller than another voltage of the second break point, wherein the device has a maximum current density flowing between the first and second electrode regions when the device is applied with an electrostatic discharge surge, wherein the first break point has a current density, which is smaller than the maximum current density, and wherein the second break point has another current density, which is larger than the maximum current density.

25. The device according to claim 24, further comprising:

a first terminal disposed on the substrate and connecting to the first electrode region; and a second terminal disposed on the substrate and connecting to the second electrode region, wherein the semiconductor substrate includes a surface portion, wherein the low concentration region is disposed in the surface portion of the substrate, wherein the device has the current-voltage characteristic through the first and second terminals, and wherein the current-voltage characteristic is drastically changed at the first and second break points.

26. The device according to claim 24, wherein the maximum current density is equal to 200 A/mm$^2$.

27. The device according to claim 24, wherein the device is used for an automotive vehicle.

28. The device according to claim 24, wherein the device is connected in series with a diode, a metal oxide semiconductor transistor, a lateral diffused metal oxide semiconductor transistor, a vertical type diffused metal oxide semiconductor transistor, an up-drain diffused metal oxide semiconductor transistor, an insulated gate bipolar transistor or a field stop insulated gate bipolar transistor.

29. The device according to claim 24, wherein the device is a controller for controlling an electric power.

30. The device according to claim 24, wherein the first conductivity type is an N conductivity type, and the second conductivity type is a P conductivity type.

* * * * *